(12) United States Patent
Mack et al.

(10) Patent No.: US 8,987,592 B2
(45) Date of Patent: Mar. 24, 2015

(54) FLAME-PROOF HOUSING

(75) Inventors: Wilhelm Mack, Dörrenzimmern (DE);
Willy Grübel, Schöntal-Sindeldorf (DE); Tatjana Kapp, Öhringen (DE); Andreas Wulff, Künzelsau (DE); Wilfried Hess, Gaildorf (DE)

(73) Assignee: Konecranes PLC, Hyvinkaa (FI)

( * ) Notice: Subject to any disclaimer, the term of this patent is extended or adjusted under 35 U.S.C. 154(b) by 147 days.

(21) Appl. No.: 13/814,859

(22) PCT Filed: Mar. 27, 2012

(86) PCT No.: PCT/EP2012/055418
§ 371 (c)(1),
(2), (4) Date: Apr. 25, 2013

(87) PCT Pub. No.: WO2012/130849
PCT Pub. Date: Oct. 4, 2012

(65) Prior Publication Data
US 2013/0292150 A1    Nov. 7, 2013

(30) Foreign Application Priority Data

Apr. 1, 2011  (DE) .......... 10 2011 001 723

(51) Int. Cl.
| H05K 5/00 | (2006.01) |
| F16J 12/00 | (2006.01) |
| H01H 9/04 | (2006.01) |
| H02B 1/28 | (2006.01) |
| B21D 51/52 | (2006.01) |

(52) U.S. Cl.
CPC .............. *H05K 5/0004* (2013.01); *F16J 12/00* (2013.01); *H01H 9/042* (2013.01); *H02B 1/28* (2013.01); *B21D 51/52* (2013.01); *Y10S 248/906* (2013.01)
USPC ............... 174/50; 174/58; 439/535; 248/906

(58) Field of Classification Search
USPC ............... 174/50; 439/535; 248/906
See application file for complete search history.

(56) References Cited

U.S. PATENT DOCUMENTS

| 3,236,404 A * | 2/1966 | Boscamp .............. 220/4.24 |
| 4,322,388 A | 3/1982 | Hardin et al. |
| 6,552,911 B1 * | 4/2003 | Haupt et al. ............ 361/752 |

FOREIGN PATENT DOCUMENTS

| DE | 18 01 062 A1 | 10/1969 |
| DE | 87 01980 U1 | 2/1987 |
| DE | 296 15 522 U1 | 9/1996 |
| EP | 0 452 778 A2 | 10/1991 |

OTHER PUBLICATIONS

European Patent Office, International Search Report in International Patent Application No. PCT/EP2012/055418 (Jun. 21, 2012).

* cited by examiner

*Primary Examiner* — Dhirubhai R Patel
(74) *Attorney, Agent, or Firm* — Leydig, Voit & Mayer, Ltd.

(57) ABSTRACT

A flame-proof housing (10) of the protection type ex-d is made from two sheet metal blanks that are bent in a u-shaped fashion. They then are fitted into one another and subsequently welded together by means of a peripheral fillet weld without welding seam preparation. A large opening (28) can be provided on one side of the housing (10), which can be closed with a threaded cover or with a flat cover.

10 Claims, 5 Drawing Sheets

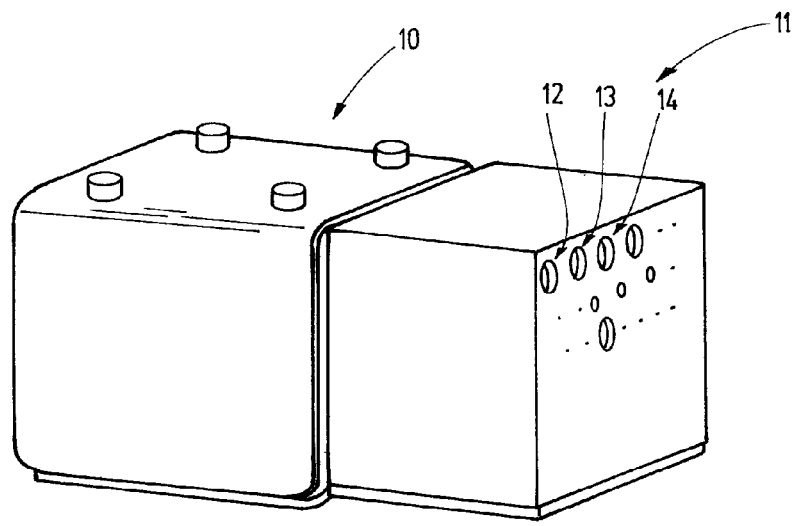
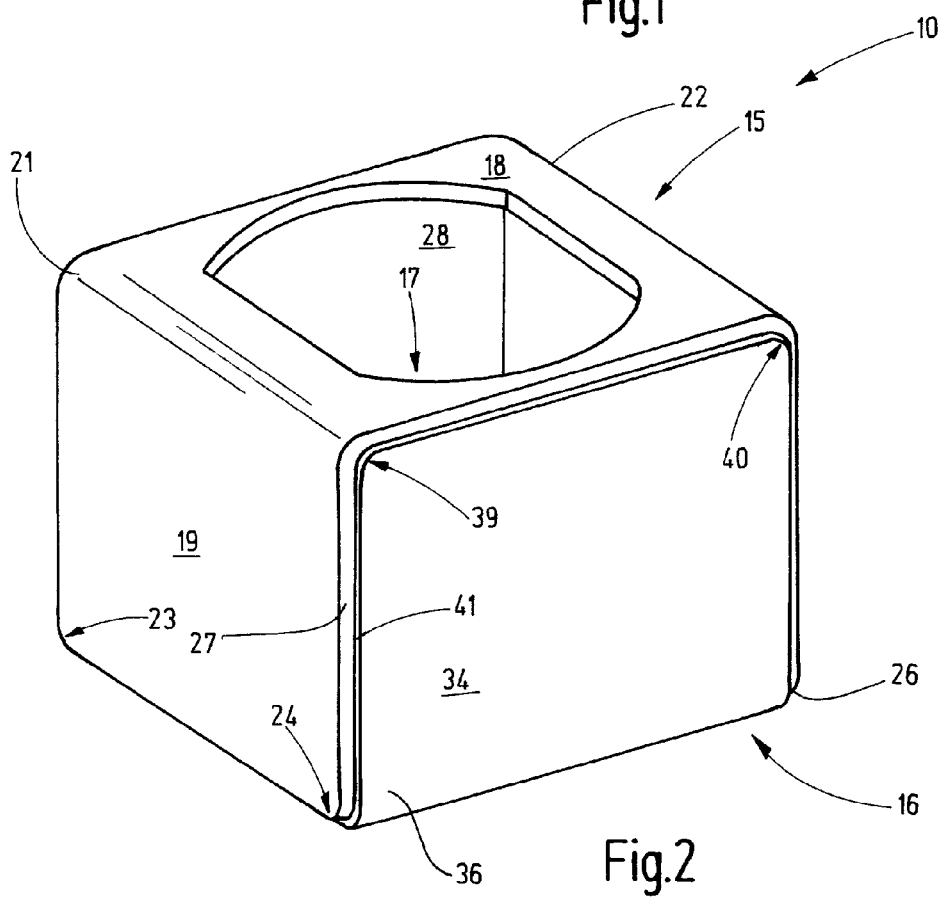

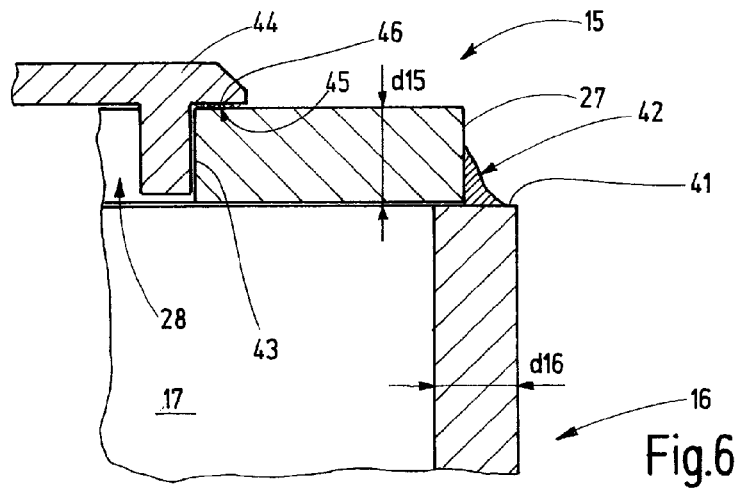
Fig.6
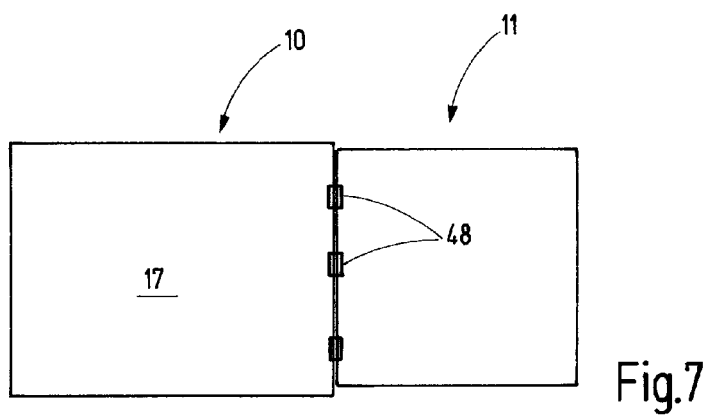
Fig.7
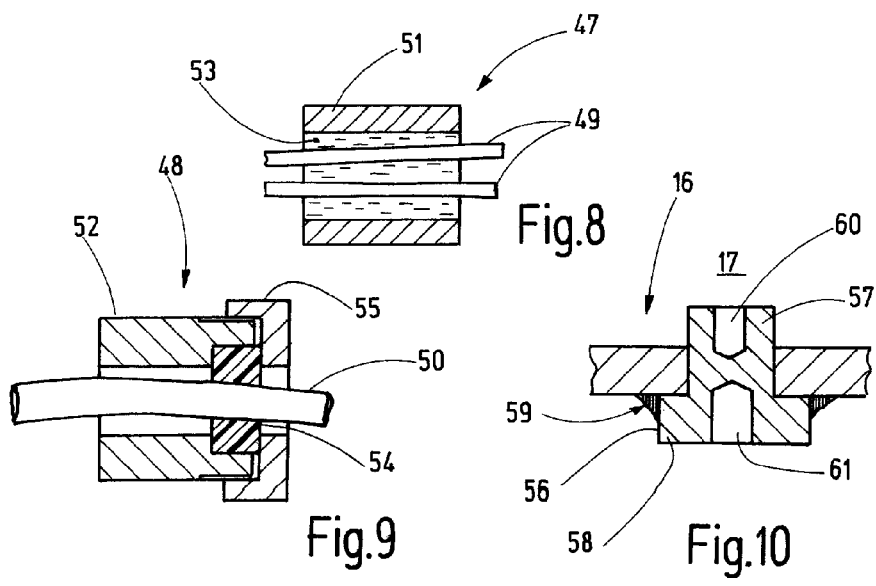
Fig.8
Fig.9
Fig.10

FLAME-PROOF HOUSING

FIELD OF THE INVENTION

The present invention relates to flame-proof housings and to a method for the manufacture thereof.

BACKGROUND OF THE INVENTION

Devices that operate in potentially explosive environments and contain or may form ignition sources need to be enclosed in such a way that safe operation can be ensured. In practical applications, this is effected with flame-proof housings that safely enclose an explosion resulting from the ignition of an explosive gas mixture admitted into the housing such that neither flames nor glowing particles can end up outside the housing.

DE 40 18 205 C2 discloses a flame-proof housing of this type that is composed of several interconnected components. It consists of plates that are welded to one another, wherein a hinged cover is provided on one of the plates.

DE 2006 013 017 A1 proposes a hermetically sealed housing that consists of two components, namely a cup-like component and a cover-like component. The two components are screwed to one another. They are made in the form of castings.

DE 21 12 224 C3 proposes an explosion-proof housing of the protection type flame-proof encapsulation (ex-d) that is in the form of a cylindrical vessel with rounded cover and a bottom. The cover is screwed to the other cup-like housing component.

DE 30 35 835 discloses a flame-proof housing with a cuboid shape for the explosion-proof encapsulation of electrical devices. It features a rectangular opening and a rectangular cover that is mounted on the housing in a pivotable and displaceable fashion by means of swing arms. It can be secured in the closed position by means of locking elements. A similar housing is known from DE 1 170 890.

With respect to the manufacture of housing bodies, DE 1 801 062 proposes to make a housing of sheet steel components that are connected by means of welding. The side walls can be reinforced with welded-in plates. The front wall and the rear wall may be in the form of angled sheets, the free limbs of which overlap the region of the side walls. In this case, the welded-in plates on the sides may have a greater thickness than the front side and the rear side of the housing.

The manufacture of an explosion-proof housing is an elaborate process. Consequently, there is a need for a concept that makes it possible to substantially automate the manufacture of explosion-proof housings with high process reliability.

OBJECTS AND SUMMARY OF THE INVENTION

It is an object of the invention to provide a flame-proof encapsulation protection type housing that is relatively simple is construction, reliable in use, and lends itself to economical manufacture.

The inventive housing of the protection type flame-proof encapsulation (ex-d) comprises two preferably u-shaped housing shells that engage into one another and are connected by means of a closed, non-branched endless welding seam. When the welding seam is produced, the point of the welding seam at which the welding process is completed coincides with the point of the welding seam at which the welding process was started. The welding seam therefore forms a spatially closed ring. In the case of a cuboid housing, the welding seam connects eight abutting housing edges. Two of these housing edges preferably lie on the bottom, two on the top and four on the sides.

It is preferred that the two housing shells respectively consist of a base section, two opposing sides of which are bent in the same direction. In a side view, each housing shell therefore has an approximate U-shape. The lateral sections preferably are bent relative to the base section by an angle of 90°. Other angles may be used if non-cuboid housings are manufactured. In the case of a cuboid housing, the manufacture of the housing shells begins with rectangular sheet metal blanks that have rounded corners. The bending zones at which the lateral sections transform into the base section preferably consist of straight, strip-shaped regions that extend parallel to one another.

The base section and the lateral sections of the housing shells may be in the form of plane surface areas. However, curvatures or additional bending lines may also be provided if non-cuboid housings should be manufactured.

The base sections of each housing shell form jaw openings with their two lateral sections. Each jaw opening is closed by a lateral section of the other respective housing shell. The welding seam extends along the edge of all jaw openings.

For the manufacture of the housing shells, a relatively thick-walled steel plate is preferably used. The wall thickness preferably lies in the range of several millimeters, e.g., between 5 mm and 30 mm, the plate thickness, for example, may be 12 mm, 15 mm or 20 mm. Strip-shaped abutting surfaces, on which the welding seam is arranged, result on the edges of each housing shell. In this case, the welding seam extends over the entire length of each strip-shaped abutting surface of each housing shell. The welding seam is preferably is in the form of a fillet weld.

The housing preferably features rounded bending edges (i.e., bending zones). In this case, the rounding of the corners of the individual lateral sections preferably corresponds to the rounding of the bending edge. The welding seam does not have any pointed corners along its course, whereby the manufacture can be automated with high quality.

The housing may have at least one closed or closable opening. A cover is preferably provided on the opening, e.g., partially inserted into the opening or attached to the opening such that a desired minimum gap length, e.g., of 25 mm results. If the cover is screwed on the opening, the required gap length can also be effected with the thread if the wall thickness is smaller than the desired gap length, e.g., of 25 mm.

The housing also may be connected to another housing with a different type of protection such as, for example, an ex-e housing.

Other objects and advantages of the invention will become apparent upon reading the following detailed description and upon reference to the drawings, in which:

BRIEF DESCRIPTION OF THE DRAWINGS

FIG. 1 is a perspective of an illustrative explosion-proof housing of the protection type flame-proof encapsulation in accordance with the invention, with an attached housing with a different type of protection, FIG. 2 is an enlarged perspective of the explosion-proof housing shown in FIG. 1;

FIG. 6 is an enlarged fragmentary section of the housing shown in FIG. 3 showing one of the welding seams and an installed cover;

FIG. 7 is a side elevational view of the housing arrangement shown in FIG. 1,

FIGS. 8 and 9 are fragmentary sections of lead-through apertures in the housing shown in FIG. 7;

FIG. 10 is a fragmentary section of a leg of the illustrative housing; and

Figure 3:
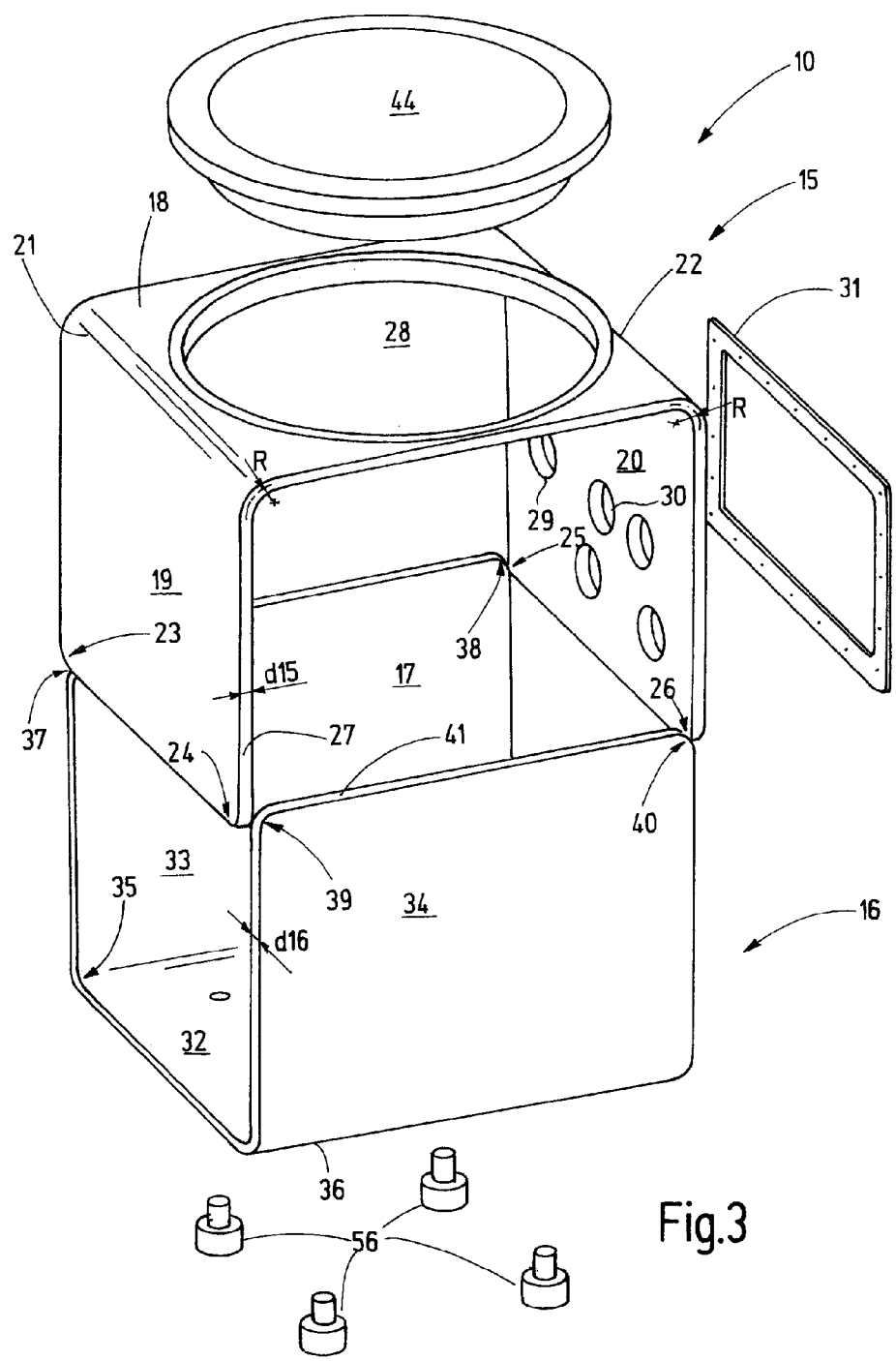
FIG. 3 is an enlarged perspective exploded view of a slightly modified embodiment of the housing shown in FIG. 2.

While the invention is susceptible of various modifications and alternative constructions, certain illustrative embodiments thereof have been shown in the drawings and will be described below in detail. It should be understood, however that there is no intention to limit the invention to the specific form disclosed, but on the contrary, the invention is to cover all modifications, alternative constructions and equivalents falling within the spirit and scope of the invention.

DETAILED DESCRIPTION OF THE PREFERRED EMBODIMENTS

Referring now more particularly, FIG. 1 of the drawings, there is shown an illustrative housing 10 in accordance with the invention of the flame-proof encapsulation design (ex-d) that may contain, e.g., an electric circuit. The elements of the electric circuit such as, e.g., capacitors, relays, switches, transistors, resistors, circuits, fuses or the like can represent ignition sources or at least form ignition sources in a defect scenario. The housing 10 encloses these elements in an explosion-proof fashion. The housing 10 may accommodate, e.g., the control of a hoisting gear or the like. In the present example, the housing 10 is screwed to an additional housing 11. This additional housing may accommodate, e.g., terminals or the like, i.e., elements that do not form an ignition source. The design of the housing 11 may differ from the design of the housing 10. For example, the housing 11 may be welded together of several plates and have openings 12, 13, 14, e.g., for leading in cables. Other designs are also possible.

The inventive housing 10, as illustrated separately in FIG. 2, comprises a first housing shell 15 and a second housing shell 16 that are welded to one another. The two housing shells 15, 16 are complementary to one another such that they can engage one another and thusly enclose an interior 17. The further structure of the housing 10 and its housing shells 15, 16 is illustrated in FIG. 3 in the form of a slightly modified embodiment of the housing 10:

The first housing shell 15 is in the form of a one piece bent sheet metal part. It comprises a base section 18 that in the present example has a rectangular shape and is connected to two lateral sections 19, 20. Bending zones 21, 22 that extend parallel to one another are formed between the base section 18 and the lateral sections 19, 20, wherein the base section 18 transforms into the lateral sections 19, 20 with a defined bending radius R in these bending zones. The bending radius R preferably is slightly larger than the wall thickness d15 that may lie, e.g., in the range between 10 mm and 25 mm, and more specifically, can be 12 mm, 15 mm or 20 mm in the presently described exemplary embodiment. The base section 18 and the lateral sections 19, 20 preferably have a uniform wall thickness.

The lateral sections 19, 20 preferably have rounded corners 23, 24, 25, 26. The first housing shell 15 therefore has a strip-shaped edge 27 that extends all around along the borders of the bottom section 18 and the lateral sections 19, 20 and does not have any sharp corners.

The housing shell 15 may have openings such as, e.g., one large opening 28 that may be circular as shown or sectionally rounded only as depicted in FIG. 2, or defined rectangular or otherwise polygonal in another variation. The opening 28 preferably occupies a large part of the surface of the base section 18.

Other openings 29, 30 may be provided, e.g., on the lateral section 20 or also on the lateral section 19. For example, these openings 29, 30 may serve as lead-throughs, e.g., for leading cables into the housing 11. The gasket 31 illustrated in FIG. 3 may be arranged between the two housings 10, 11 in order to prevent the formation of open gaps that could produce a connection between the interior 17 and the surroundings.

The second housing shell 16 is designed similar and complementary to the first housing shell 15. In FIG. 3, the housing shell 15 is U-shaped with downwardly directed limbs, while the second housing shell 16 is U-shaped with upwardly directed limbs. The housing shell 16 is formed by a base section 32 that is connected to lateral sections 33, 34. These lateral sections transform into the base section in bending zones 35, 36. The bending zones 35, 36 have a bending radius that preferably corresponds to the corner radii of the corners 23, 24, 25, 26. Vice versa, the lateral sections have corners 33, 34, 37, 38, 39, 49, the corner radii of which correspond to the bending radii R.

The respective lateral sections 19, 20 and 33, 34 preferably extend at a right angle to the corresponding base section 18 or 32. Consequently, the lateral sections 19 and 20 are oriented parallel to one another, and the lateral sections 33, 34 also are preferably oriented parallel to one another. The dimensions of the lateral sections 19, 20, 33, 34 and of the base sections 18, 32 are chosen such that the housing shells 15, 16 can be pushed together and the lateral sections 33, 34 close the jaw-like lateral openings defined by the housing shell 15 while the lateral sections 19, 20 close the jaw-like lateral openings defined by the housing shell 16. In this case, the housing shell 16 abuts the housing shell 15 along the entire edge 27 thereof.

The housing shell 16 has a strip-shaped edge 41 that follows the entire contour of the housing shell 16 and does not contain any corners or points due to the rounding of the corners 37, 38, 39, 40 and of the bending zones 35, 36. This strip-shaped edge furthermore forms a closed edge. The wall sections 33, 34 and the base section 32 of the housing shell 16 may have a wall thickness d16 that may correspond to the wall thickness d15. However, it may preferably also be chosen smaller than the wall thickness d15, particularly if a wall thickness d16 that is smaller than the wall thickness d15 suffices for achieving the required flame-proofness. It may be practical to specify a greater wall thickness d15 such that possible existing gaps on the openings 28, 29, 30 have a length that ensures the desired explosion protection. In this case, the gaps are so narrow and long that no flash-over can occur and no hot particles can pass through the gap.

Figure 4:
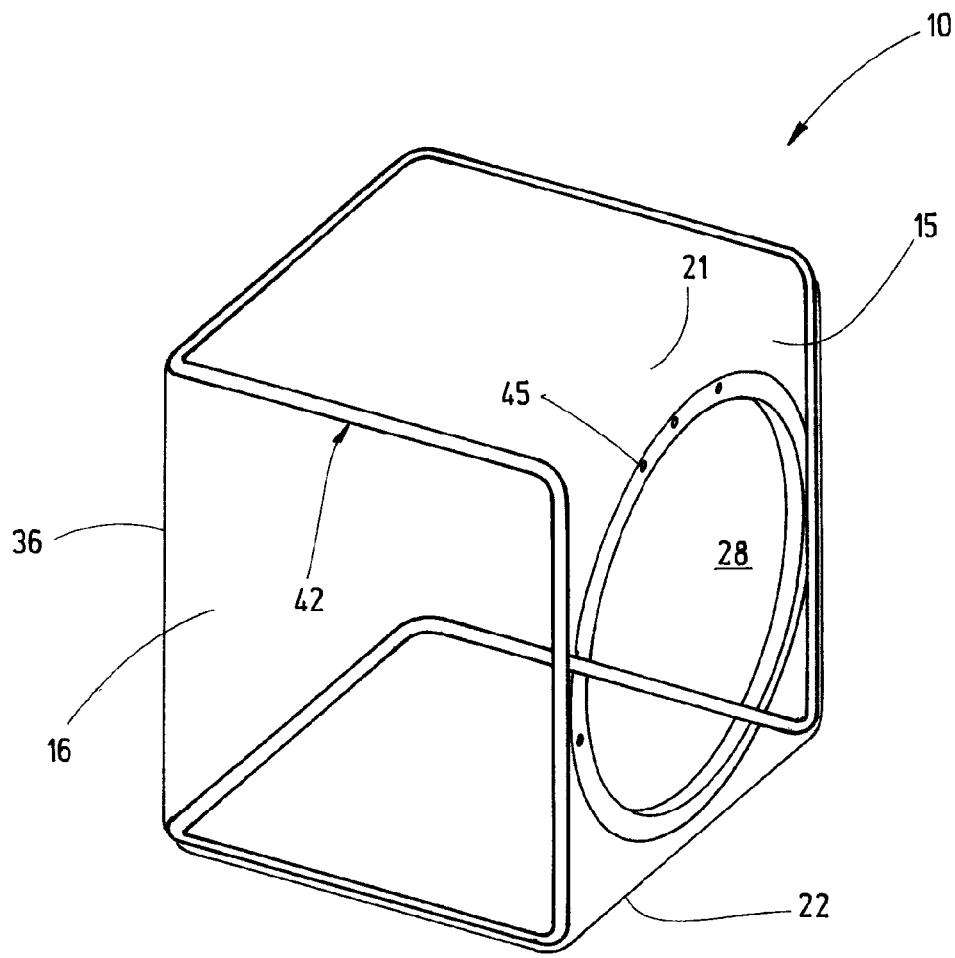
FIG. 4 is a perspective of the housing shown in FIG. 3, illustrating the course of its welding seam.

The two housing shells 15, 16 are connected by a welding seam 42 that is illustrated in the form of a thick black curve in FIG. 4 in order to provide a better overview. The welding seam 42 in this case forms a closed welding seam, i.e., the welding seam is continuously produced without interruption from the point at which it was started until it once again reaches the starting point. At least in topological respects, it represents a closed endless ring that, however, is spatially deformed and therefore extends along eight edges of the cuboid formed by the housing 10. The remaining four edges of this cuboid are formed by the respective bending zones 21, 22 and 35, 36.

Figure 5:
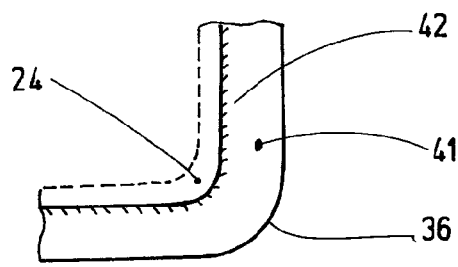
FIG. 5 is a fragmentary view of a corner region of the housing depicted in the foregoing views.

FIG. 5 depicts the exemplary course of the welding seam 42 on the corner 24 and the bending zone 36 (see also FIG. 2). The design is in this case chosen such that the housing shell 15 lies on the edge 41. The welding seam 42 is a fillet weld between the edges 27, 41, as further depicted in FIG. 6. Such arrangement may also be used in this way if the wall thickness d16 of the housing shell 16 is less than the wall thickness d15 of the first housing shell 15.

FIG. 6 further depicts one way for closing the opening 28. The wall of this opening 28 may be provided with a thread 43 into which a cover 44 is screwed. The thread 43 provides a gap length that is greater than the wall thickness d15. Consequently, a gap length, e.g., of 20 mm or 25 mm can also be achieved with wall thicknesses d15 that are smaller than this dimension. In this and other embodiments of the invention, it is possible to provide the opening 28 with a circumferential axial projection, i.e., a collar or a neck. This also applies to the openings 29, 30 and is particularly practical with smaller wall thicknesses.

A gasket 46 may be arranged as an additional seal between the cover 44 and an annular sealing surface that, if so required, is precision-machined and surrounds the opening 28. The sealing surface 45 may contain one or more bores that serve for receiving safety screws, safety pins, mounting screws or the like. The bores preferably consist of blind holes. It is also possible to provide other options for closing the opening 28 such as, e.g., a ring of threaded blind holes surrounding the opening 28 for attaching a screw-on cover or the like.

FIG. 7 symbolically shows the connection between the housings 10 and 11. Wire lead-throughs 47, e.g., according to FIG. 8 or cable lead-throughs 48, e.g., according to FIG. 9 between the two housings 10, 11 may be arranged in the openings 29, 30. They respectively serve for leading through wires 49 or cables 50 that may be secured in a corresponding socket 51, 52 by means of a casting compound 53 or a gasket 54. The gasket 54 may be secured in place and subjected to axial tension, e.g., by means of a coupling ring 55 in order to fix the cable 50 while simultaneously closing a lead-through gap.

Such cable lead-throughs 48 make it possible to insert a preassembled electric or electronic unit into the interior through the large opening 28 and to simultaneously push electrical connections into the housing 11, in which they are then contacted, e.g., by a terminal device, through the openings 29, 30 and therefore the cable lead-throughs 48. All openings that are not tightly closed, but rather may leave open flashover-proof gaps, are preferably arranged on one housing shell only, in this case on the housing shell 15. This housing shell preferably has a wall thickness d15 that is at least as large as or larger than the wall thickness d16.

Mounting means such as, e.g., device legs 56 may be provided on the housing shell 16. The legs 56 in this case have a cylindrical body 57 and a disk-shaped flange 58 that is preferably arranged on the outside. The flange 58 may be peripherally welded to the housing shell 16 by means of an annular welding seam 59 (FIG. 10). The device legs 56 may be provided with threaded holes 60, 61 toward the inside 17, as well as on the outside. These threaded holes preferably consist of blind holes such that no passage is created.

Figure 11:
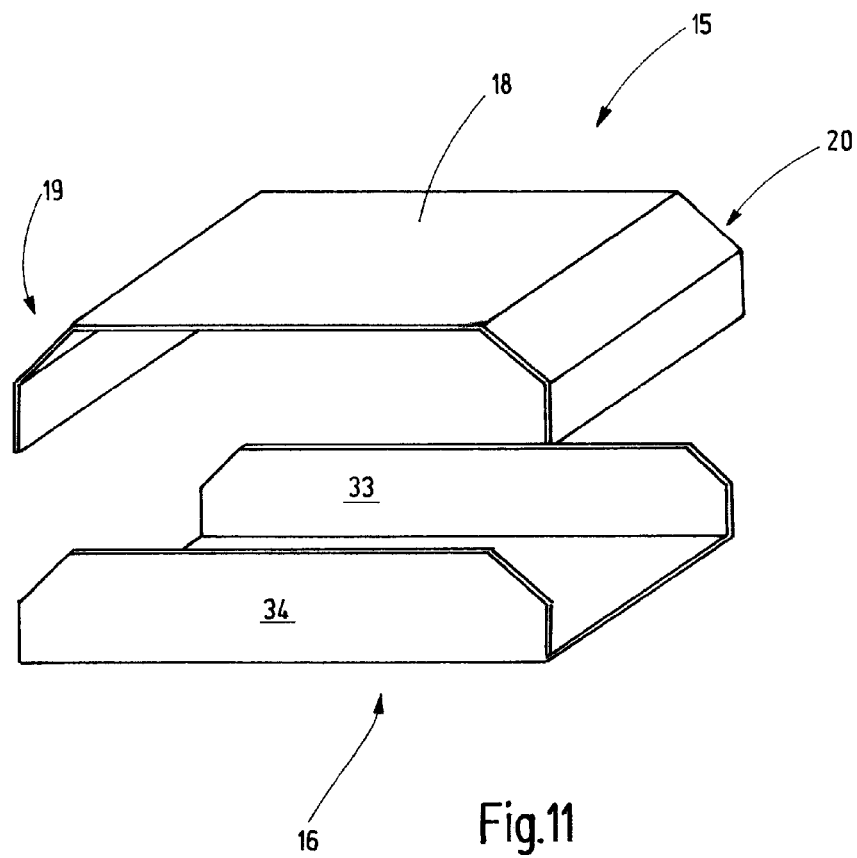
FIG. 11 is a schematic exploded view of a modified embodiment of housing according to the invention.

The housing 10 has been described above with reference to a cuboid housing. According to FIG. 11, however, it may also have different shapes consistent with the inventive concept. For example, the lateral sections 19, 20 may be rounded or angled several times as shown. The lateral sections 33, 34 have a correspondingly adapted complementary contour such that they once again close the jaw-like openings of the upper housing shell 15 without a gap. The two housing shells 15, 16 are once again connected by means of a closed peripheral welding seam in order to enclose an interior. Each of the housing shells 15, 16 may have openings consistent with the preceding description.

The manufacture of the housing 10 preferably starts with suitably provided sheet metal blanks. They may consist of rectangular sheet metal blanks with rounded corners that are cut out, e.g., by means of a laser cutting process. The respective bending zones 21, 22 and 35, 36 are produced in a second step. In other words, the sheet metal blanks are angled in such a way that the lateral sections 19, 20 extend parallel to one another and, e.g., at a right angle with reference to the base section 18. This similarly applies to the lateral sections 33, 34 and the base section 32.

In the next step, the housing shells 15, 16 are fitted into one another such that the border of an edge such as, e.g., the inner border of the edge 27 lies on the edge 41. In this state, the welding seam 42 extending along the entire edge 41 can be produced, e.g., with an automatic welding machine.

If so required, the housing 10 may be subjected to one or more additional treatment steps after the welding seam 42 has been produced. For example, the housing 10 may be annealed for relieving stress. The mechanical processing of connecting surfaces or threads, e.g., in the openings 28, 29, 30 may also be carried out after the welding seam 42 has been produced.

Hence, it can be seen that the manufacture of a flame-proof housing of the protection type ex-d starts with two sheet metal blanks that are bent in a u-shaped fashion. They are fitted into one another, tacked and subsequently welded together by means of a peripheral fillet weld without welding seam preparation. A large opening 28 is preferably provided on one side of the housing 10 that can be closed with a threaded cover or with a flat cover.

The invention claimed is:

1. A housing (10) of the flame-proof encapsulation protection type for enclosing electrical elements that may be or may form ignition sources comprising,
   two housing shells (15, 16) engaging each other,
   a first (15) of said housing shells (15, 16) having a base section (18) and two lateral sections (19, 20) that are connected to and include an angle with the base section (18) on opposing sides thereof such that the two lateral sections (19, 20) form first jaw openings with a first shape that are defined on three sides,
   a second (16) of said housing shells (15, 16) having a base section (32) and two lateral sections (33, 34) that are connected to and include an angle with the base section (32) on opposing sides thereof such that the two lateral sections (33, 34) form jaw openings with a second shape that are defined on three sides,
   said two housing shells (15, 16) being arranged such that their lateral sections (19, 20; 33, 34) engage one another, and the lateral sections (19, 20) of the first housing shell (15) close the jaw openings of the second housing shell (16), and the lateral sections (33, 34) of the second housing shell (16) close the jaw openings of the first housing shell (15),
   said housing shells (15,16) engage one another along edges (27, 41), said first of said housing shells (15) having an edge (27) in the form of a strip-shaped abutting surface that is at least partially overlapped by the second housing shell (16), and
   a welding seam (42) extending along the edges (27, 41) over the entire length thereof without a gap, said welding seam (42) being in the form of a fillet weld between an edge (27) of the first housing shell (15) and an edge (41) of the second housing shell (16).

2. The housing according to claim 1 in which said lateral sections (19, 20; 33, 34) have rounded corners.

3. The housing according to claim 1 in which the base sections (18, 32) of the housing shells (15, 16) respectively transform into the lateral sections (19, 20; 33, 34) with rounded bending zones (21, 22; 35, 36).

4. The housing according to claim 3 in which said lateral sections (19, 20, 33, 34) have rounded courses and said rounded bending zones (21, 22) of one housing shell (15) have a cylindrical curvature that corresponds to the rounding of a respective abutting corner (37, 38, 39, 40) of the other housing shell (16).

5. The housing according to claim 1 in which said housing shells (15, 16) have respective wall thicknesses (d15, d16).

6. The housing according to claim 1 in which one of the housing shells (15, 16) has at least one opening (28) that is closed with a cover (44).

7. The housing according to claim 6 in which said one of said housing shells (15, 16) that has said opening (28) has additional openings (29, 30) that define a gap.

8. The housing according to claim 7 in which wire lead-throughs (47) and/or cable lead-throughs (48) are arranged in the additional openings (29, 30).

9. A housing (10) of the flame-proof encapsulation protection type for enclosing electrical elements that may be or may form ignition sources comprising,
  two housing shells (15, 16) engaging each other,
  a first (15) of said housing shells (15, 16) having a base section (18) and two lateral sections (19, 20) that are connected to and include an angle with the base section (18) on opposing sides thereof such that the two lateral sections (19, 20) form first jaw openings with a first shape that are defined on three sides,
  a second (16) of said housing shells (15, 16) having a base section (32) and two lateral sections (33, 34) that are connected to and include an angle with the base section (32) on opposing sides thereof such that the two lateral sections (33, 34) form jaw openings with a second shape that are defined on three sides,
  said two housing shells (15, 16) being arranged such that their lateral sections (19, 20; 33, 34) engage one another, and the lateral sections (19, 20) of the first housing shell (15) close the jaw openings of the second housing shell (16), and the lateral sections (33, 34) of the second housing shell (16) close the jaw openings of the first housing shell (15),
  said housing shells (15,16) engage one another along edges (27, 41), and an endless welding seam (42) extending along the edges (27, 41) over the entire length thereof without a gap, and
  one of said housing shells (15, 16) having at least one opening (28), an electrical wire or cable lead-through (47, 48) arranged in said opening for electrical conduction between electrical components inside the housing to outside the housing, said lead-through (47, 48) including a gasket (54) for securing the lead-through (47, 48) in sealed relation to the interior of the housing, and said gasket (54) including a coupling ring (55) for simultaneously affixing the lead-through (47, 48) and closing the opening.

10. A method for manufacturing housings (10) of the flame-proof encapsulation protection type for enclosing electrical elements that may be or may form ignition sources comprising the steps of:
  bending a first sheet metal blank with defined radius (R) along two straight bending lines (21, 22) to form a first housing shell (15) having a base section (18) and two lateral sections (19, 20) that are connected to and include an angle with the base section (18) on opposing sides thereof such that the two lateral sections (19, 20) form first jaw openings with a first shape that are defined on three sides and which have an edge (27) in the form of a strip-shaped abutting surface,
  bending a second sheet metal blank with defined radius along two bending lines (35, 36) to form a second housing shell (16) having a base section (32) and two lateral sections (33, 34) that are connected to and include an angle with the base section (32) on opposing sides thereof such that the two lateral sections (33, 34) form jaw openings with a second shape that are defined on three sides,
  fitting together the two housing shells (15, 16) such that their lateral sections (19, 20; 33, 34) engage one another with the lateral sections (19, 20) of the first housing shell (15) close the jaw openings of the second housing shell (16) the lateral sections (33, 34) of the second housing shell (16) close the jaw openings of the first housing shell (15) and with the lateral edge (27) of the first shell being at least partially overlapped by the second housing shell (16),
  forming a closed, non-branched endless welding seam (42) along an entire edge of the two sheet metal blanks in the form of a fillet weld between an edge (27) of the first housing shell (15) and the edge (41) of the second housing shell (16), and
  forming one of the housing shells (15, 16) with an opening (28), arranging an electrical wire of cable lead-through (47, 48) in said opening, securing said lead-through (47, 48) in sealed relation to the opening by a gasket (54) having a coupling ring (55) which simultaneously affixes the lead-through (47, 48) and closes the opening (28).

* * * * *